(12) United States Patent
Shahmohammadi et al.

(10) Patent No.: US 11,025,198 B2
(45) Date of Patent: Jun. 1, 2021

(54) RADIO FREQUENCY OSCILLATOR

(71) Applicant: Huawei Technologies Co., Ltd., Shenzhen (CN)

(72) Inventors: Mina Shahmohammadi, Pijnacker (NL); Masoud Babaie, Pijnacker (NL); Robert Bogdan Staszewski, Delft (NL)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/848,528

(22) Filed: Apr. 14, 2020

(65) Prior Publication Data

US 2020/0313617 A1 Oct. 1, 2020

Related U.S. Application Data

(63) Continuation of application No. 15/659,322, filed on Jul. 25, 2017, now Pat. No. 10,644,648, which is a (Continued)

(51) Int. Cl.
*H03B 5/12* (2006.01)
*H03F 3/193* (2006.01)
(Continued)

(52) U.S. Cl.
CPC ......... *H03B 5/1243* (2013.01); *H03B 5/1218* (2013.01); *H03B 5/1228* (2013.01);
(Continued)

(58) Field of Classification Search
CPC .......... H03F 1/565; H03F 3/193; H03F 3/245; H03F 3/72; H03B 5/1228; H03B 5/1265;
(Continued)

(56) References Cited

U.S. PATENT DOCUMENTS 6,388,517 B1 5/2002 Goma et al.
6,606,008 B2 8/2003 Traub
(Continued)

FOREIGN PATENT DOCUMENTS

CN 102870323 A 1/2013
CN 103299541 A 9/2013
CN 104272583 A 1/2015

OTHER PUBLICATIONS

Baek et al., "A Dual-Band (13/22-GHz) VCO Based on Resonant Mode Switching," IEEE Microwave and Wireless Components Letters, vol. 13, No. 10, pp. 443-445, Institute of Electrical and Electronics Engineers, New York, New York (Oct. 2003).
(Continued)

*Primary Examiner* — Arnold M Kinkead
(74) *Attorney, Agent, or Firm* — Leydig, Voit & Mayer, Ltd.

(57) ABSTRACT

The invention relates to a radio frequency oscillator, the radio frequency oscillator comprising a resonator circuit being resonant at an excitation of the resonator circuit in a differential mode and at an excitation of the resonator circuit in a common mode, wherein the resonator circuit has a differential mode resonance frequency at the excitation in the differential mode, and wherein the resonator circuit has a common mode resonance frequency at the excitation in the common mode, a first excitation circuit being configured to excite the resonator circuit in the differential mode to obtain a differential mode oscillator signal oscillating at the differential mode resonance frequency, and a second excitation circuit being configured to excite the resonator circuit in the common mode to obtain a common mode oscillator signal oscillating at the common mode resonance frequency.

10 Claims, 10 Drawing Sheets

Related U.S. Application Data continuation of application No. PCT/EP2015/051574, filed on Jan. 27, 2015.

(51) Int. Cl.
  *H03F 1/56* (2006.01)
  *H03F 3/24* (2006.01)
  *H03F 3/72* (2006.01)

(52) U.S. Cl.
  CPC ......... *H03B 5/1262* (2013.01); *H03B 5/1296* (2013.01); *H03F 1/565* (2013.01); *H03F 3/193* (2013.01); *H03F 3/245* (2013.01); *H03F 3/72* (2013.01); *H03B 2201/0266* (2013.01)

(58) Field of Classification Search
  CPC .. H03B 5/1293; H03B 5/1218; H03B 5/1243; H03B 5/1296; H03B 5/1262; H03B 2200/0266; H04B 1/44
  USPC ............. 331/177 V, 167, 117 FE, 2, 46
  See application file for complete search history.

(56) References Cited

U.S. PATENT DOCUMENTS

| | | | |
|---|---|---|---|
| 10,637,395 B2* | 4/2020 | Shahmohammadi | H03B 5/1218 |
| 10,644,648 B2* | 5/2020 | Shahmohammadi | H03B 5/1243 |
| 2009/0195324 A1* | 8/2009 | Li | H01F 19/04 333/25 |
| 2011/0018644 A1 | 1/2011 | Yun et al. | |
| 2012/0161890 A1 | 6/2012 | Li et al. | |
| 2013/0309983 A1 | 11/2013 | Ashckenazi et al. | |
| 2014/0320215 A1 | 10/2014 | Staszewski et al. | |
| 2014/0357206 A1* | 12/2014 | Tsai | H03H 7/48 455/127.1 |

OTHER PUBLICATIONS

Bevilacqua, "Transformer-Based Dual-Mode Voltage-Controlled Oscillators," IEEE Transactions on Circuits and Systems-II: Express Briefs, vol. 54, No. 4, pp. 293-297, Institute of Electrical and Electronic Engineers, New York, New York (Apr. 2007).

Fanori et al., "A 2.4-to-5.3GHz Dual-Core CMOS VCO with Concentric 8-shaped coils," ISSCC, Session 21, Frequency Generation Techniques 21.6, Institute of Electrical and Electronics Engineers, New York, New York (Feb. 12, 2014).

Babaie et al., "A Class-F CMOS Oscillator," IEEE Journal of Solid-State Circuits, vol. 48, No. 12, pp. 3120-3133, Institute of Electrical and Electronic Engineers, New York, New York (Dec. 2013).

Li et al., "A Distributed Dual-Band LC Oscillator based on Mode Switching," IEEE Transactions on Microwave: Theory and Techniques, vol. 59, No. 1, pp. 99-107, Institute of Electrical and Electronics Engineers, New York, New York (Jan. 2011).

Li et al., "A Low-Phase-Noise Wide-Tuning-Range Oscillator Based on Resonant Mode Switching," IEEE Journal of Solid-State Circuits, vol. 47, No. 6, pp. 1295-1308, Institute of Electrical and Electronics Engineers, New York, New York (Jun. 2012).

Taghivand et al., "A 3.24-to-8.45GHz Low-Phase-Noise Mode-Switching Oscillator," ISSCC, Session 21, Frequency Generation Techniques 21.5, Institute of Electrical and Electronics Engineers, New York, New York (Feb. 12, 2014).

EP/15701359.0-1206, Office Action, dated Jan. 2, 2020.

CN/201580074788, Notice of Allowance, dated Dec. 2, 2020.

U.S. Appl. No. 15/659,322, dated Jul. 25, 2017.

Nguyen et al., "A New Transformer-Coupled Differential Armstrong VCO for Very Low Power Operation", IEEE Asian Solid-State Circuits Conference, Beijing, China, pp. 1-4, Institute of Electrical and Electronics Engineers, New York, New York (Nov. 8-10, 2010).

* cited by examiner

RADIO FREQUENCY OSCILLATOR

CROSS-REFERENCE TO RELATED APPLICATIONS

This application is a continuation of U.S. patent application Ser. No. 15/659,322, filed on Jul. 25, 2017, issued as U.S. Pat. No. 10,644,648 on May 5, 2020, which is a continuation of International Application No. PCT/EP2015/051574, filed on Jan. 27, 2015. All of the afore-mentioned patent applications are hereby incorporated by reference in their entireties.

TECHNICAL FIELD

The invention relates to the field of radio frequency (RF) oscillators.

BACKGROUND

Radio frequency oscillators are widely used in a variety of applications, such as for instance multi-mode multi-band applications. Radio frequency oscillators usually comprise resonator circuits as frequency selective elements, wherein the resonator circuits comprise inductors and capacitors. The inductors and capacitors are connected to be in resonance at a specific resonance frequency. For providing a high tuning range of a radio frequency oscillator, different approaches are applied.

An exemplary approach to provide an increased tuning range is to employ two separate radio frequency oscillators having separate resonator circuits and using high frequency multiplexers, which can lead to an increased power consumption and noise floor and can demand for a large die area. In L. Fanori et al., "A 2.4-to-5.3 GHz dual core CMOS VCO with concentric 8-shape coils," ISSCC Dig. Tech. Papers, pp 370-372, 17-21 Feb. 2013, a topology having separate resonator circuits is described.

A further exemplary approach is based on switching between even and odd resonance modes of a high-order LC resonator circuit within a radio frequency oscillator. A separation of resonance peaks in the different modes can be achieved, however, leading to a large size of the LC resonator circuit. In G. Li. et al., A Distributed dual-band LC oscillator based on Mode Switching," IEEE TMTT, vol. 59, no. 1, pp. 99-107, January 2011, a topology using mode switching is described.

Common radio frequency oscillators providing a high tuning range suffer from an increased noise floor and/or an increased size, in particular when implemented as radio frequency integrated circuits (RFICs) on semiconductor substrates.

SUMMARY

It is an object of the invention to provide an efficient radio frequency oscillator.

This object is achieved by the features of the independent claims. Further implementation forms are apparent from the dependent claims, the description and the figures.

The invention is based on the finding that a resonator circuit can be employed, wherein the resonator circuit is resonant at an excitation in a differential mode and at an excitation in a common mode. The resonator circuit can have different resonance frequencies when excited in the differential mode and the common mode, wherein the differential mode resonance frequency and the common mode resonance frequency can be tunable. This difference may be due to a different magnetic or inductive coupling factor, $k_m$, when the resonator circuit is excited in the differential mode or the common mode. In particular, in the differential mode the coupling factor may be high, while in the common mode the coupling factor may be low.

The resonator circuit is excited by a first excitation circuit in the differential mode and by a second excitation circuit in the common mode. Therefore, a differential mode oscillator signal oscillating at the differential mode resonance frequency and a common mode oscillator signal oscillating at the common mode resonance frequency are provided. The resonator circuit and the first excitation circuit can be arranged to form a cross-coupled oscillator or a transformer-coupled oscillator. The resonator circuit and the second excitation circuit can be arranged to form a Colpitts oscillator. Consequently, the radio frequency oscillator employs a single resonator circuit or tank circuit. Furthermore, extra tuning range can be gained using the common mode oscillation without any area penalty or degradation of the differential mode oscillation performance.

Efficient structures of the radio frequency oscillator and the resonator circuit are provided, allowing for a high tuning range of the radio frequency oscillator while having a low size. The radio frequency oscillator and the resonator circuit can be compact. The resonator circuit and the radio frequency oscillator are suited for implementation as radio frequency integrated circuits (RFICs) on semiconductor substrates.

According to a first aspect, the invention relates to a radio frequency oscillator, the radio frequency oscillator comprising a resonator circuit being resonant at an excitation of the resonator circuit in a differential mode and at an excitation of the resonator circuit in a common mode, wherein the resonator circuit has a differential mode resonance frequency at the excitation in the differential mode, and wherein the resonator circuit has a common mode resonance frequency at the excitation in the common mode, a first excitation circuit being configured to excite the resonator circuit in the differential mode to obtain a differential mode oscillator signal oscillating at the differential mode resonance frequency, and a second excitation circuit being configured to excite the resonator circuit in the common mode to obtain a common mode oscillator signal oscillating at the common mode resonance frequency. Thus, an efficient radio frequency oscillator is provided.

The radio frequency oscillator can be a dual-mode radio frequency oscillator providing the differential mode oscillator signal and the common mode oscillator signal.

The resonator circuit can be a tank circuit. The resonator circuit can be used as a frequency selective element within the radio frequency oscillator. The resonator circuit can be resonant when excited in the differential mode and in the common mode.

In a first implementation form of the radio frequency oscillator according to the first aspect as such, the resonator circuit comprises a transformer, a primary capacitor, and a secondary capacitor, wherein the transformer comprises a primary winding and a secondary winding, the primary winding being inductively coupled with the secondary winding, wherein the primary capacitor is connected to the primary winding, the primary capacitor and the primary winding forming a primary circuit, and wherein the secondary capacitor is connected to the secondary winding, the secondary capacitor and the secondary winding forming a secondary circuit. Thus, an efficient resonator circuit is used within the radio frequency oscillator.

The differential mode resonance frequency can depend on the inductance of the primary winding, the inductance of the secondary winding, the capacitance of the primary capacitor, and the capacitance of the secondary capacitor.

The common mode resonance frequency can depend on the inductance of the primary winding and the capacitance of the primary capacitor. The common mode resonance frequency may not depend on the inductance of the secondary winding and the capacitance of the secondary capacitor.

In a second implementation form of the radio frequency oscillator according to the first implementation form of the first aspect, the resonator circuit has the common mode resonance frequency at an excitation of the primary circuit in the common mode, and the resonator circuit has the differential mode resonance frequency at an excitation of the primary circuit in the differential mode. Thus, the differential mode oscillator signal and the common mode oscillator signal can be provided efficiently.

The primary winding and the secondary winding can be arranged to provide a strong inductive coupling when the primary circuit is excited in the differential mode and a weak inductive coupling when the primary circuit is excited in the common mode.

In a third implementation form of the radio frequency oscillator according to the first implementation form or the second implementation form of the first aspect, the primary winding of the transformer comprises one turn, and the secondary winding of the transformer comprises two turns. Thus, a resonator circuit with area efficiency is provided.

When the primary winding is excited in differential mode within a 1:2 transformer, induced currents at the secondary winding can have the same direction resulting in a strong coupling factor. A common mode excitation of the primary winding can induce currents at the secondary winding that circulate in opposite directions canceling each other resulting in a weak coupling factor.

A 2:1 transformer can have the same properties and can be used alternatively. 1:2 transformers and 2:1 transformers can be smallest size transformers having this property thus being area efficient. The primary capacitor can comprise a pair of single-ended capacitors for an efficient provision of a common mode oscillation.

In a fourth implementation form of the radio frequency oscillator according to the first implementation form to the third implementation form of the first aspect, the primary winding of the transformer and/or the secondary winding of the transformer is planar. Thus, a resonator circuit with area efficiency is provided.

In a fifth implementation form of the radio frequency oscillator according to the first implementation form to the fourth implementation form of the first aspect, the primary winding of the transformer and the secondary winding of the transformer are arranged on the same plane. Thus, a high coupling factor in differential mode and a low coupling factor in common mode is provided efficiently.

Different planes for the primary winding and the secondary winding can be used yielding a reduced size. In this case, the coupling factor in differential mode may be not as high as for the primary winding and the secondary winding of the transformer being arranged on the same plane. Furthermore, the winding being arranged at a lower metal plane can have a reduced quality factor Q and can yield a decreased phase noise performance. For the primary winding and the secondary winding being arranged on the same plane, a high coupling factor in differential mode and a low coupling factor in common mode is thus provided efficiently.

The primary winding of the transformer and/or the secondary winding of the transformer can comprise a bridging portion being arranged at a different plane.

In a sixth implementation form of the radio frequency oscillator according to the first implementation form to the fifth implementation form of the first aspect, the primary winding of the transformer and/or the secondary winding of the transformer is connected to a constant voltage source or a ground potential. Thus, a tapping of the primary winding and/or the secondary winding is realized. Both the primary winding and the secondary winding may be connected to a constant voltage source respectively in order to enable an efficient start-up of the radio frequency oscillator.

The tapping of the primary winding and/or the secondary winding can be a symmetrical center tapping of the primary winding and/or the secondary winding. The center tapping at the primary winding can reduce the common mode resonance frequency and can increase an overlap between differential mode and common mode oscillation frequencies. This may not influence the tuning range of the radio frequency oscillator.

In a seventh implementation form of the radio frequency oscillator according to the first implementation form to the sixth implementation form of the first aspect, the primary capacitor of the primary circuit comprises a pair of single-ended capacitors. Thus, a reference to ground potential of the primary circuit is realized.

In an eighth implementation form of the radio frequency oscillator according to the first implementation form to the seventh implementation form of the first aspect, the secondary capacitor of the secondary circuit comprises a pair of differential capacitors. Thus, a reference to ground potential of the secondary circuit is avoided minimizing the effect of the secondary winding in common mode excitations. The pair of differential capacitors can be a pair of balanced capacitors.

In a ninth implementation form of the radio frequency oscillator according to the first implementation form to the eighth implementation form of the first aspect, the primary capacitor and/or the secondary capacitor comprises a variable capacitor, in particular a digitally tunable capacitor. Thus, a variation of the differential mode resonance frequency and/or the common mode resonance frequency can be realized efficiently.

In a tenth implementation form of the radio frequency oscillator according to the first implementation form to the ninth implementation form of the first aspect, the primary capacitor is connected in parallel to the primary winding, and/or the secondary capacitor is connected in parallel to the secondary winding. Thus, the primary circuit and the secondary circuit are realized as parallel circuits.

In an eleventh implementation form of the radio frequency oscillator according to the first aspect as such or any preceding implementation form of the first aspect, the first excitation circuit and/or the second excitation circuit comprises at least one transistor, in particular at least one field-effect transistor, for exciting the resonator circuit. Thus, an active device is employed for exciting the resonator circuit. The transistor can be a trans-conductance gm transistor. In order to realize a cross-coupled structure at least two transistors may be employed. The transistors can be metal-oxide-semiconductor field-effect transistors (MOSFETs).

In a twelfth implementation form of the radio frequency oscillator according to the first aspect as such or any preceding implementation form of the first aspect, the first excitation circuit comprises a transistor for controlling, in particular for activating and deactivating, the excitation of the resonator circuit in the differential mode, and/or the second excitation circuit comprises a transistor for controlling, in particular for activating and deactivating, the excitation of the resonator circuit in the common mode. Thus, the excitation of the resonator circuit in the differential mode and/or in the common mode can be controlled efficiently.

In a thirteenth implementation form of the radio frequency oscillator according to the first aspect as such or any preceding implementation form of the first aspect, the resonator circuit and the first excitation circuit are arranged to form a cross-coupled oscillator or a transformer-coupled oscillator to obtain the differential mode oscillator signal. Thus, an efficient excitation in differential mode is realized.

In a fourteenth implementation form of the radio frequency oscillator according to the first aspect as such or any preceding implementation form of the first aspect, the resonator circuit and the second excitation circuit are arranged to form a Colpitts oscillator to obtain the common mode oscillator signal. Thus, an efficient excitation in common mode is realized.

In a fifteenth implementation form of the radio frequency oscillator according to the fourteenth implementation form of the first aspect, the Colpitts oscillator comprises a first auxiliary oscillator and a second auxiliary oscillator, the first auxiliary oscillator being synchronizable with regard to the second auxiliary oscillator in frequency and phase. Thus, an injection locking between the first auxiliary oscillator and the second auxiliary oscillator is realized.

The two auxiliary oscillators comprised by the Colpitts oscillator can be locked together via a switch realized by a transistor, e.g. a MOS transistor. This switch can be off and can disconnect the outputs of the two auxiliary oscillators when the oscillator works in differential mode excitation. A differential mode oscillation can e.g. be provided when the Colpitts oscillator is off and the transformer-coupled oscillator is on.

In a sixteenth implementation form of the radio frequency oscillator according to the fourteenth implementation form or the fifteenth implementation form of the first aspect, the Colpitts oscillator is a single-ended oscillator. Thus, a reference to ground potential is realized.

According to a second aspect, the invention relates to a method for providing a differential mode oscillator signal and a common mode oscillator signal using a radio frequency oscillator, the radio frequency oscillator comprising a resonator circuit, a first excitation circuit, and a second excitation circuit, the resonator circuit being resonant at an excitation of the resonator circuit in a differential mode and at an excitation of the resonator circuit in a common mode, wherein the resonator circuit has a differential mode resonance frequency at the excitation in the differential mode, and wherein the resonator circuit has a common mode resonance frequency at the excitation in the common mode, the method comprising exciting, by the first excitation circuit, the resonator circuit in the differential mode to obtain the differential mode oscillator signal oscillating at the differential mode resonance frequency, and exciting, by the second excitation circuit, the resonator circuit in the common mode to obtain the common mode oscillator signal oscillating at the common mode resonance frequency. Thus, the differential mode oscillator signal and the common mode oscillator signal are provided efficiently.

The method can be performed by the radio frequency oscillator. Further features of the method directly result from the functionality of the radio frequency oscillator.

The invention can be implemented using hardware and/or software.

SHORT DESCRIPTION OF EMBODIMENTS

Embodiments of the invention will be described with respect to the following figures, in which.

DETAILED DESCRIPTION OF EMBODIMENTS

The design of radio frequency oscillators for multi-mode multi-band cellular applications can demand for a high tuning range (TR) while ensuring low phase noise (PN) for a wide range of frequency bands and channels. Low quality factors Q of resonator circuits, e.g. comprising switched-capacitor networks for wide tuning ranges, can limit the phase noise performance of radio frequency oscillators.

Embodiments of the invention are based on an increased tuning range of a radio frequency oscillator having a single resonator circuit by introducing a common mode oscillation. The common mode oscillation increases the tuning range of the radio frequency oscillator without any die area and/or phase noise penalty. The radio frequency oscillator can be regarded as a dual-mode radio frequency oscillator having a single resonator circuit. The resonator circuit can also be referred to as a tank circuit.

Figure 1:
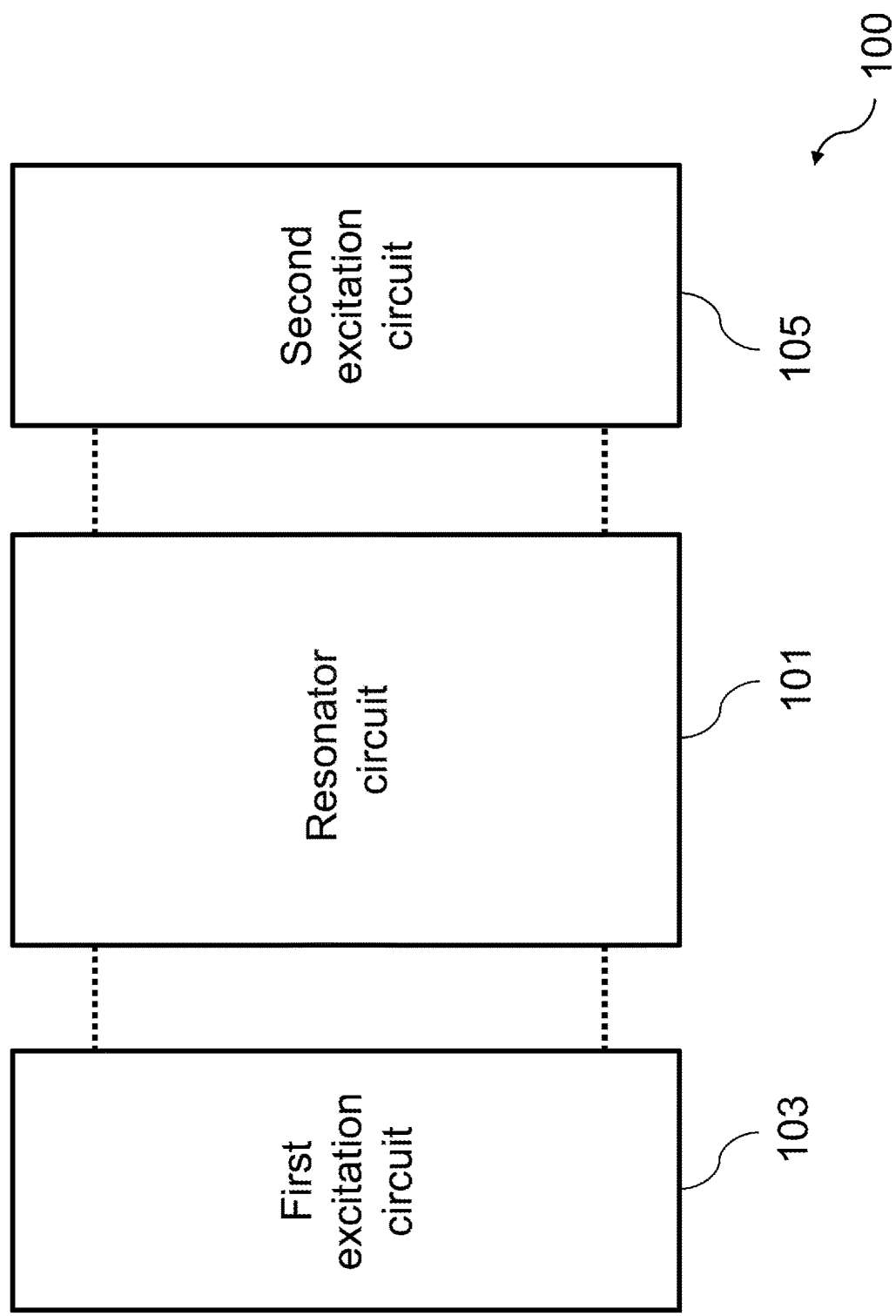
FIG. 1 shows a diagram of a radio frequency oscillator according to an embodiment.

FIG. 1 shows a diagram of a radio frequency oscillator 100 according to an embodiment. The radio frequency oscillator 100 comprises a resonator circuit 101 being resonant at an excitation of the resonator circuit 101 in a differential mode and at an excitation of the resonator circuit 101 in a common mode, wherein the resonator circuit 101 has a differential mode resonance frequency at the excitation in the differential mode, and wherein the resonator circuit 101 has a common mode resonance frequency at the excitation in the common mode, a first excitation circuit 103 being configured to excite the resonator circuit 101 in the differential mode to obtain a differential mode oscillator signal oscillating at the differential mode resonance frequency, and a second excitation circuit 105 being configured to excite the resonator circuit 101 in the common mode to obtain a common mode oscillator signal oscillating at the common mode resonance frequency.

In an embodiment, the resonator circuit 101 comprises a transformer, a primary capacitor, and a secondary capacitor, wherein the transformer comprises a primary winding and a secondary winding, the primary winding being inductively coupled with the secondary winding, wherein the primary capacitor is connected to the primary winding, the primary capacitor and the primary winding forming a primary circuit, and wherein the secondary capacitor is connected to the secondary winding, the secondary capacitor and the secondary winding forming a secondary circuit.

Figure 2:
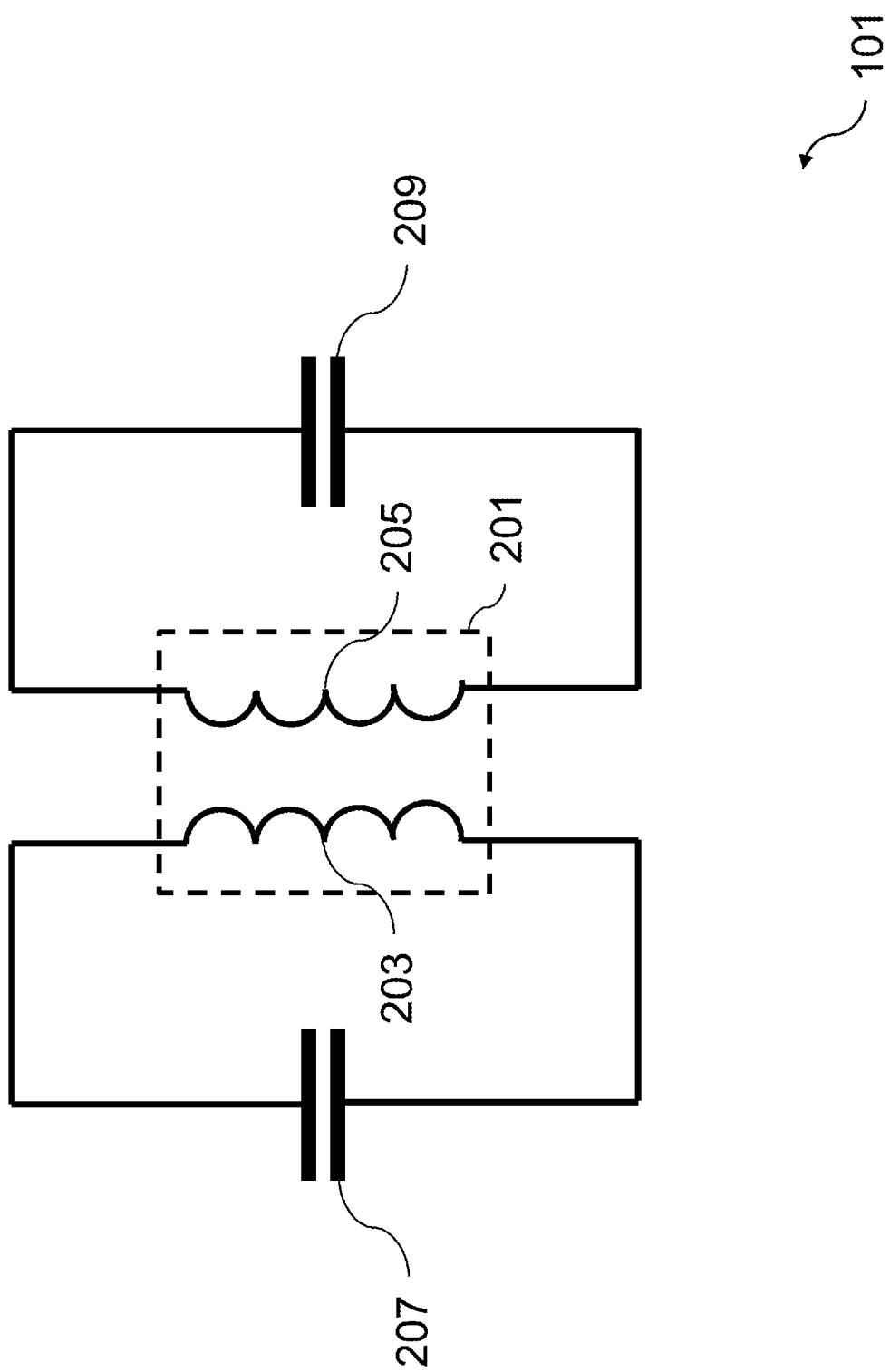
FIG. 2 shows a diagram of a resonator circuit according to an embodiment.

FIG. 2 shows a diagram of a resonator circuit 101 according to an embodiment. The resonator circuit 101 is resonant at an excitation of the resonator circuit 101 in a differential mode and at an excitation of the resonator circuit 101 in a common mode, wherein the resonator circuit 101 has a differential mode resonance frequency at the excitation in the differential mode, and wherein the resonator circuit 101 has a common mode resonance frequency at the excitation in the common mode.

The resonator circuit 101 comprises a transformer 201, a primary capacitor 207, and a secondary capacitor 209, wherein the transformer 201 comprises a primary winding 203 and a secondary winding 205, the primary winding 203 being inductively coupled with the secondary winding 205, wherein the primary capacitor 207 is connected to the primary winding 203, the primary capacitor 207 and the primary winding 203 forming a primary circuit, and wherein the secondary capacitor 209 is connected to the secondary winding 205, the secondary capacitor 209 and the secondary winding 205 forming a secondary circuit.

The resonator circuit 101 has the common mode resonance frequency at an excitation of the primary circuit in the common mode. The resonator circuit 101 has the differential mode resonance frequency at an excitation of the primary circuit in the differential mode.

In the following, further implementation forms and embodiments of the radio frequency oscillator 100 are described.

Figure 3:
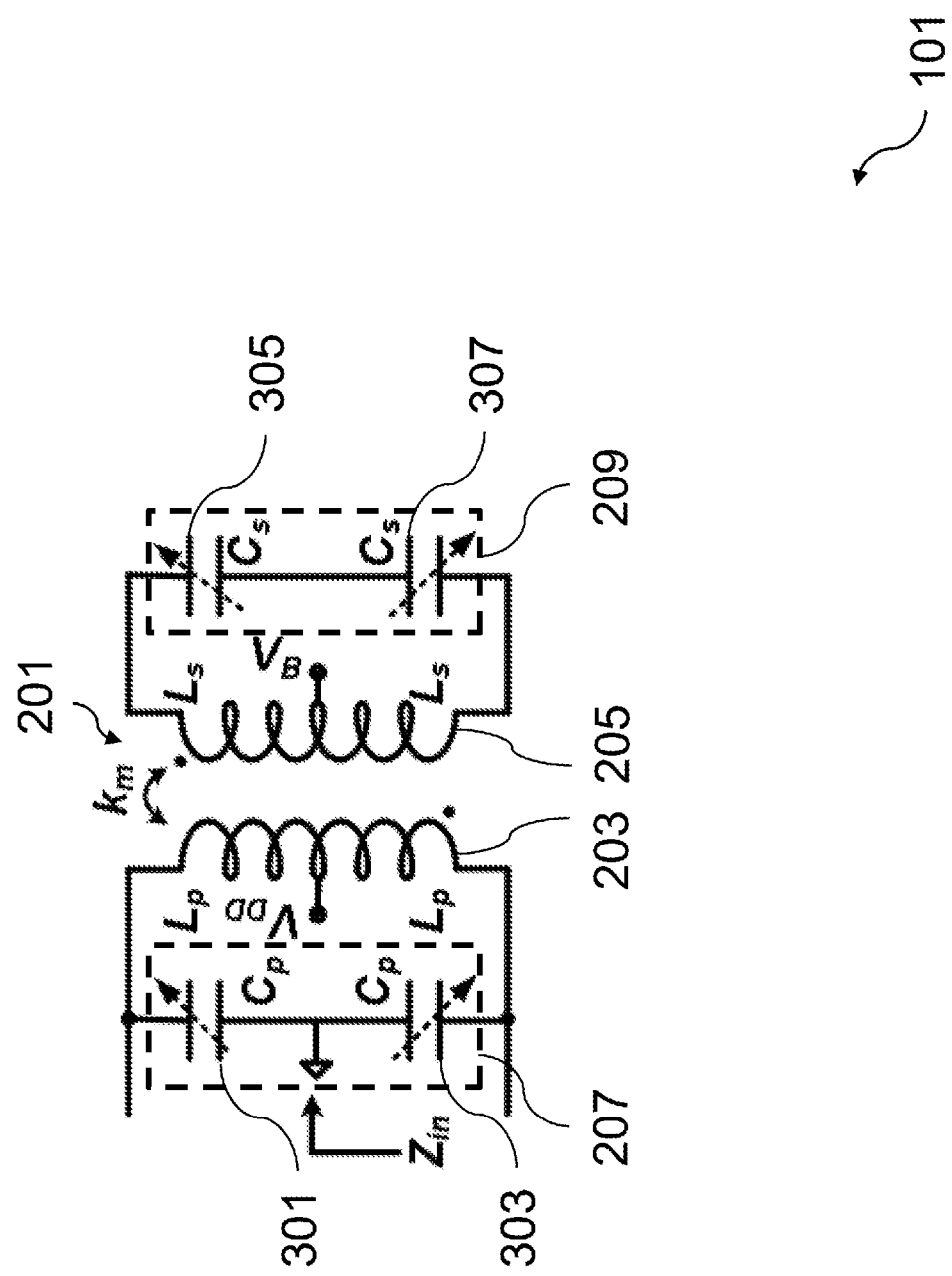
FIG. 3 shows a diagram of a resonator circuit according to an embodiment.

FIG. 3 shows a diagram of a resonator circuit 101 according to an embodiment. The resonator circuit 101 comprises a transformer 201, a primary capacitor 207, and a secondary capacitor 209, wherein the transformer 201 comprises a primary winding 203 and a secondary winding 205, the primary winding 203 being inductively coupled with the secondary winding 205, wherein the primary capacitor 207 is connected to the primary winding 203, the primary capacitor 207 and the primary winding 203 forming a primary circuit, and wherein the secondary capacitor 209 is connected to the secondary winding 205, the secondary capacitor 209 and the secondary winding 205 forming a secondary circuit.

The primary capacitor 207 of the primary circuit comprises a pair of single-ended capacitors 301, 303. The secondary capacitor 209 of the secondary circuit comprises a pair of differential capacitors 305, 307. $k_m$ denotes the magnetic or inductive coupling factor between the primary winding 203 and the secondary winding 205, wherein $0 \leq |k_m| \leq 1$.

The inductance of the primary winding 203 can be referred to as $L_p$, the inductance of the secondary winding 205 can be referred to as $L_s$, the capacitance of the primary capacitor 207 can be referred to as $C_p$, and the capacitance of the secondary capacitor 209 can be referred to as $C_s$. According to this definition, the primary winding 203, the secondary winding 205, the primary capacitor 207, and the secondary capacitor 209 are considered as individual concentrated components.

Alternatively, the inductance of the primary winding 203 can be referred to as $2 L_p$, the inductance of the secondary winding 205 can be referred to as $2 L_s$, the capacitance of the primary capacitor 207 can be referred to as 0.5 $C_p$, and the capacitance of the secondary capacitor 209 can be referred to as 0.5 $C_s$. According to this definition, the primary winding 203 and the secondary winding 205 are each formed by a pair of inductors connected in series, wherein the inductance of each inductor is referred to as $L_p$ or $L_s$, respectively. Furthermore, the primary capacitor 207 and the secondary capacitor 209 are each formed by a pair of capacitors connected in series, wherein the capacitance of each capacitor is referred to as $C_p$ or $C_s$, respectively.

Figure 4:
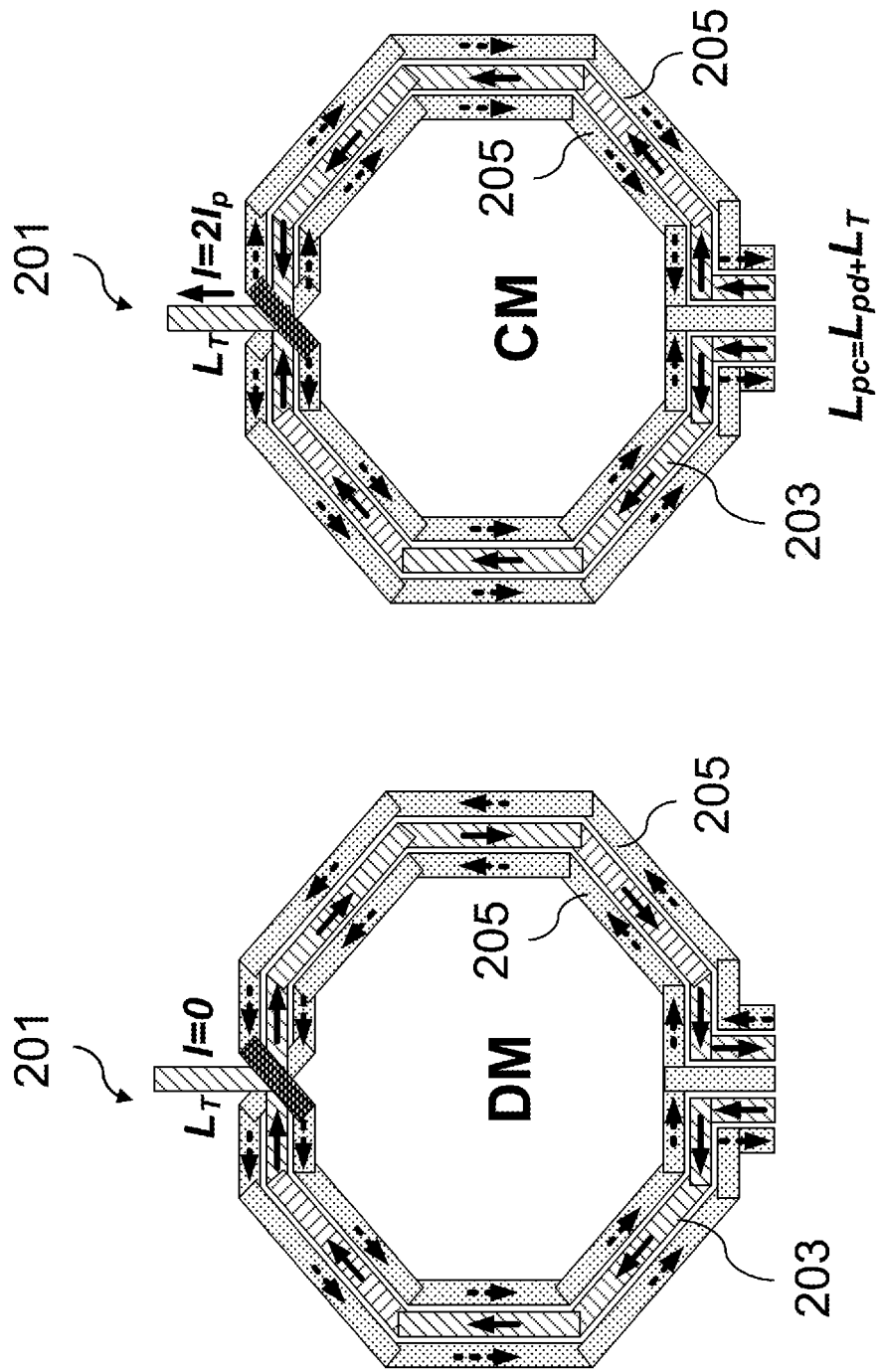
FIG. 4 shows a diagram of a transformer of a resonator circuit according to an embodiment.

FIG. 4 shows a diagram of a transformer 201 of a resonator circuit 101 according to an embodiment. The transformer 201 comprises a primary winding 203 and a secondary winding 205, the primary winding 203 being inductively coupled with the secondary winding 205. The primary winding 203 comprises one turn and the secondary winding 205 comprises two turns, realizing a ratio of turns of 1:2. The diagram illustrates induced currents within the transformer 201 at an excitation in differential mode (DM) and an excitation in common mode (CM).

Embodiments of the invention are based on different resonance frequencies of the transformer-based resonator circuit 101 at differential mode excitations and common mode excitations. The different resonance frequencies can be due to a different inductive coupling factor $k_m$ when the primary winding 203 of the transformer 201 is excited by differential mode or common mode signals.

The induced currents at the secondary winding 205 at differential mode excitation can circulate in same directions and can provide a high coupling factor $k_m$ between the primary winding 203 and the secondary winding 205 of the transformer 201. Consequently, in differential mode, the inductance of the secondary winding 205 and the capacitance of the secondary capacitor 209 can strongly affect the differential mode characteristics of the resonator circuit 101, e.g. the differential mode resonance frequency. For a coupling factor in differential mode $k_{m,DM} > 0.5$, the differential mode resonance frequency can be at $\omega_{0,DM} = 1/\text{sqrt}(L_p C_p + L_s C_s)$.

On the other hand, the induced currents at the secondary winding 205 at common mode excitation can circulate in opposite directions and can cancel each other. Hence, the coupling factor $k_m$ can be low in the common mode, e.g. $k_{m,CM} < 0.3$. This low coupling factor $k_m$ can be interpreted as the secondary winding 205 not being seen from the primary winding 203. Thus, the common mode resonance frequency can be at $\sigma_{0,CM} = 1/\text{sqrt}(L_p C_p)$. Since common mode excitation signals at the primary circuit may not see the secondary circuit, in particular the differential capacitors 305, 307, the primary capacitor 207 can comprise single-ended capacitors 301, 303. The common mode resonance frequency $\omega_{0,CM}$ can be higher than the differential mode resonance frequency $\omega_{0,DM}$ and the frequency separation can be controlled by the ratio $L_s C_s / L_p C_p$.

The differential mode resonance frequency can be determined as $\omega_{0,DM} = 1/\text{sqrt}(L_p C_p + L_s C_s)$. Further differential mode resonance frequencies can be determined as $\omega_{n,DM} = n \omega_{0,DM}$, wherein n can be any number, and wherein n can depend on an inductive coupling factor between the primary winding 203 and the secondary winding 205, and the ratio $(L_s C_s)/(L_p C_p)$.

The inductance associated with the primary winding 203 in common mode $L_{pc}$ can be different from the inductance associated with the primary winding 203 in differential mode $L_{pd}$. It can be considered in the design phase that $L_{pc} > L_{pd}$. The ratio of capacitances of the primary capacitor 207 and the secondary capacitor 209 can be designed based on a value of $L_{pc}$, e.g. $L_{pc}=L_{pd}+L_T$, wherein $L_T$ denotes an inductance of a metal track connecting the center tap of the primary winding 203 e.g. to a constant voltage source.

Figure 5:
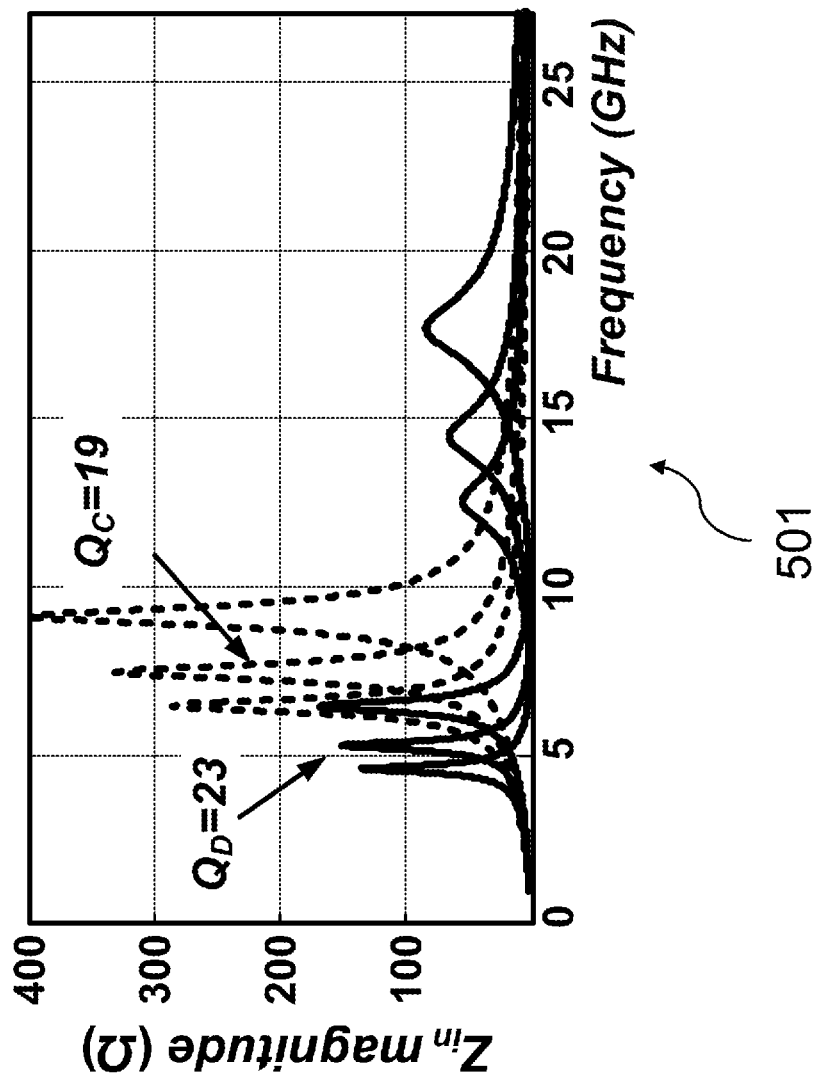
FIG. 5 shows a diagram of an input impedance response of a resonator circuit according to an embodiment.

FIG. 5 shows a diagram of an input impedance response 501 of a resonator circuit 101 according to an embodiment. The diagram illustrates differential mode resonance frequencies and common mode resonance frequencies.

The input impedance of the resonator circuit 101 is denoted as $Z_{in}$. The quality factor in common mode $Q_C$ can be slightly less than the quality factor in differential mode $Q_D$ but may be large enough such that oscillation is possible in this mode. If the quality factor of a resonator circuit is large, an oscillation start-up can easier be realized. In the diagram, $Q_C$ is smaller than $Q_D$ but is still large enough for an efficient oscillation start-up.

Assuming a maximum to minimum capacitance ratio $C_{max}/C_{min}=2$ for the primary capacitor 207 or the secondary capacitor 209, which can be variable or switchable capacitors, enabling a sufficiently high quality factor of the capacitors, both the differential mode resonance frequency and the common mode resonance frequency can vary, e.g. by 34%.

In order to avoid any gaps between the tuning ranges in differential mode and in common mode, there can be some overlap. This can mean that at least the lowest common mode resonance frequency $\omega_{CM,low}$ equals the highest differential mode resonance frequency $\omega_{DM,high}$, i.e. $\omega_{CM,low}=\omega_{DM,high}$. Satisfying the overlap relationship can result in $L_s C_s = L_p C_p$.

With these relationships, the resonance frequencies can cover an octave while going from differential mode oscillations to common mode oscillations. Practically, the ratio $C_{max}/C_{min}$ may be greater than 2, due to parasitic effects and challenges associated with controlling the precise overlap between the differential mode resonance frequencies and the common mode resonance frequencies.

In an embodiment, an octave tuning range for the radio frequency oscillator is achieved upon the basis of the following equations:

$$\frac{C_{max,p}}{C_{min,p}} = 2 \frac{C_{max,s}}{C_{min,s}} = 2$$

$$C_{max,p} = C_p, C_{max,s} = C_s$$

$$\omega_D: \frac{1}{\sqrt{L_p C_p + L_s C_s}} \sim \frac{\sqrt{2}}{\sqrt{L_p C_p + L_s C_s}}$$

$$\omega_C: \frac{1}{\sqrt{L_p C_p}} \sim \frac{\sqrt{2}}{\sqrt{L_p C_p}} \quad \underset{\text{overlap}}{\overset{\text{for}}{\Longrightarrow}} L_p C_p \infty L_s C_s$$

wherein $C_{max,p}/C_{min,p}$ denotes a maximum to minimum capacitance ratio associated with the primary capacitor 207, $C_{max,s}/C_{min,s}$ denotes a maximum to minimum capacitance ratio associated with the secondary capacitor 209, COD relates to the differential mode resonance frequencies, and $\omega_C$ relates to the common mode resonance frequencies.

Figure 6:
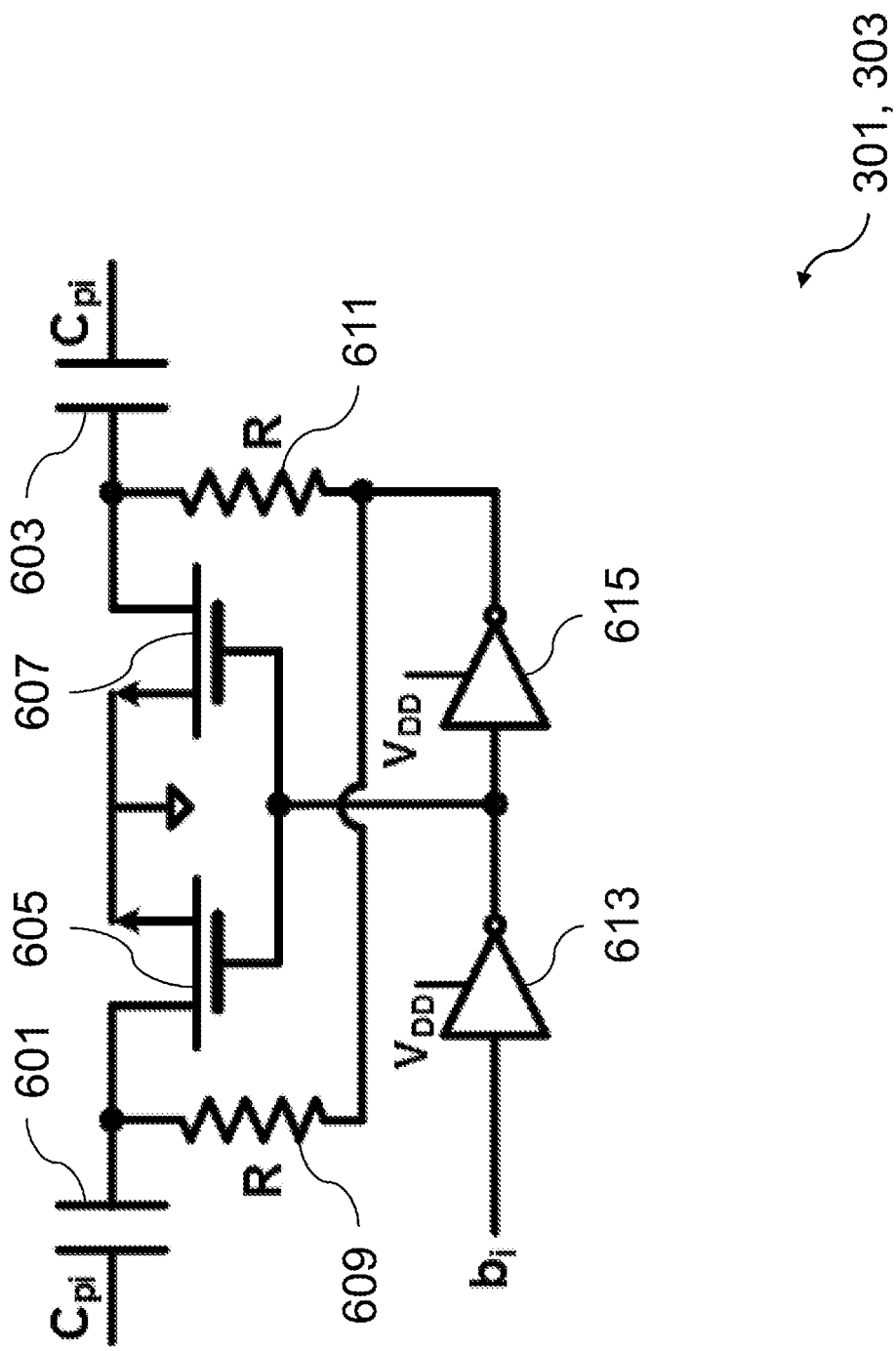
FIG. 6 shows a diagram of a single-ended capacitor according to an embodiment.

FIG. 6 shows a diagram of a single-ended capacitor 301, 303 according to an embodiment. The single-ended capacitor 301, 303 comprises a capacitor 601, a capacitor 603, a transistor 605, a transistor 607, a resistor 609, a resistor 611, an inverter 613, and an inverter 615. The single-ended capacitor 301, 303 is arranged within the primary circuit of the resonator circuit 101.

By applying a digital switching signal $b_i$, the transistor 605 and the transistor 607 can be switched between a conducting state and a non-conducting state. Consequently, the capacitance of the single-ended capacitor 301, 303 can be digitally tuned. A plurality of single-ended capacitors 301, 303 can be connected in parallel.

Figure 7:
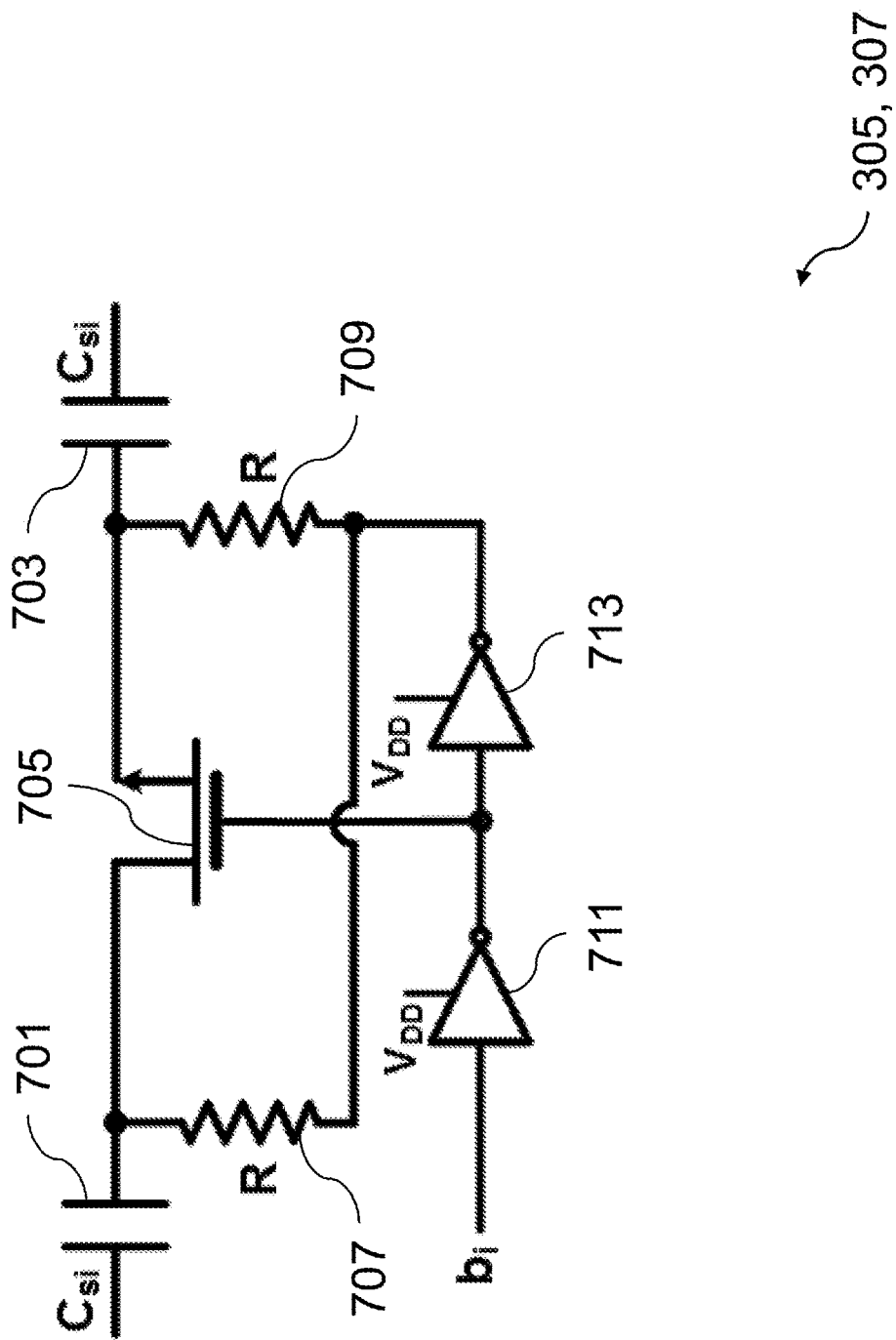
FIG. 7 shows a diagram of a differential capacitor according to an embodiment.

FIG. 7 shows a diagram of a differential capacitor 305, 307 according to an embodiment. The differential capacitor 305, 307 comprises a capacitor 701, a capacitor 703, a transistor 705, a resistor 707, a resistor 709, an inverter 711, and an inverter 713. The differential capacitor 305, 307 is arranged within the secondary circuit of the resonator circuit 101.

By applying a digital switching signal $b_i$, the transistor 705 can be switched between a conducting state and a non-conducting state. Consequently, the capacitance of the differential capacitor 305, 307 can be digitally tuned. A plurality of differential capacitors 305, 307 can be connected in parallel.

Figure 8:
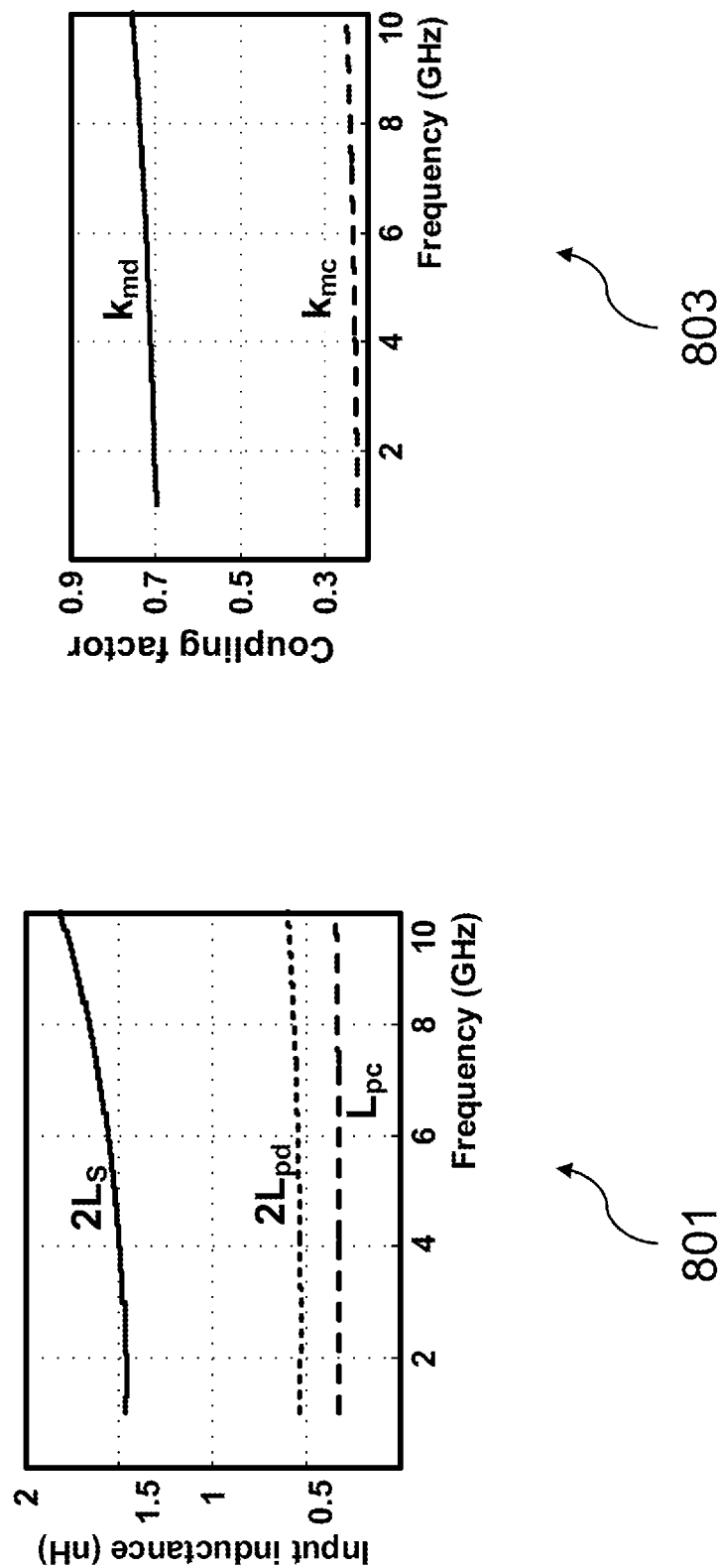
FIG. 8 shows a diagram of an input inductance response and a coupling factor response according to an embodiment.

FIG. 8 shows a diagram of an input inductance response 801 and a coupling factor response 803 according to an embodiment.

The input inductance 801 relates to the inductances of the primary winding 203 and the secondary winding 205 of the transformer 201. The inductance $2 L_s$ is approximately 1.5 nH. The inductance $2 L_{pd}$ is approximately 0.5 nH. The inductance $L_{pc}$ is approximately 0.4 nH. The inductances slightly increase with frequency.

The coupling factor response 803 relates to coupling factors of the transformer 201 at an excitation in differential mode and in common mode. The coupling factor in differential mode $k_{md}$ is approximately 0.7. The coupling factor in common mode $k_{mc}$ is approximately 0.25. The coupling factors slightly increase with frequency.

Figure 9:
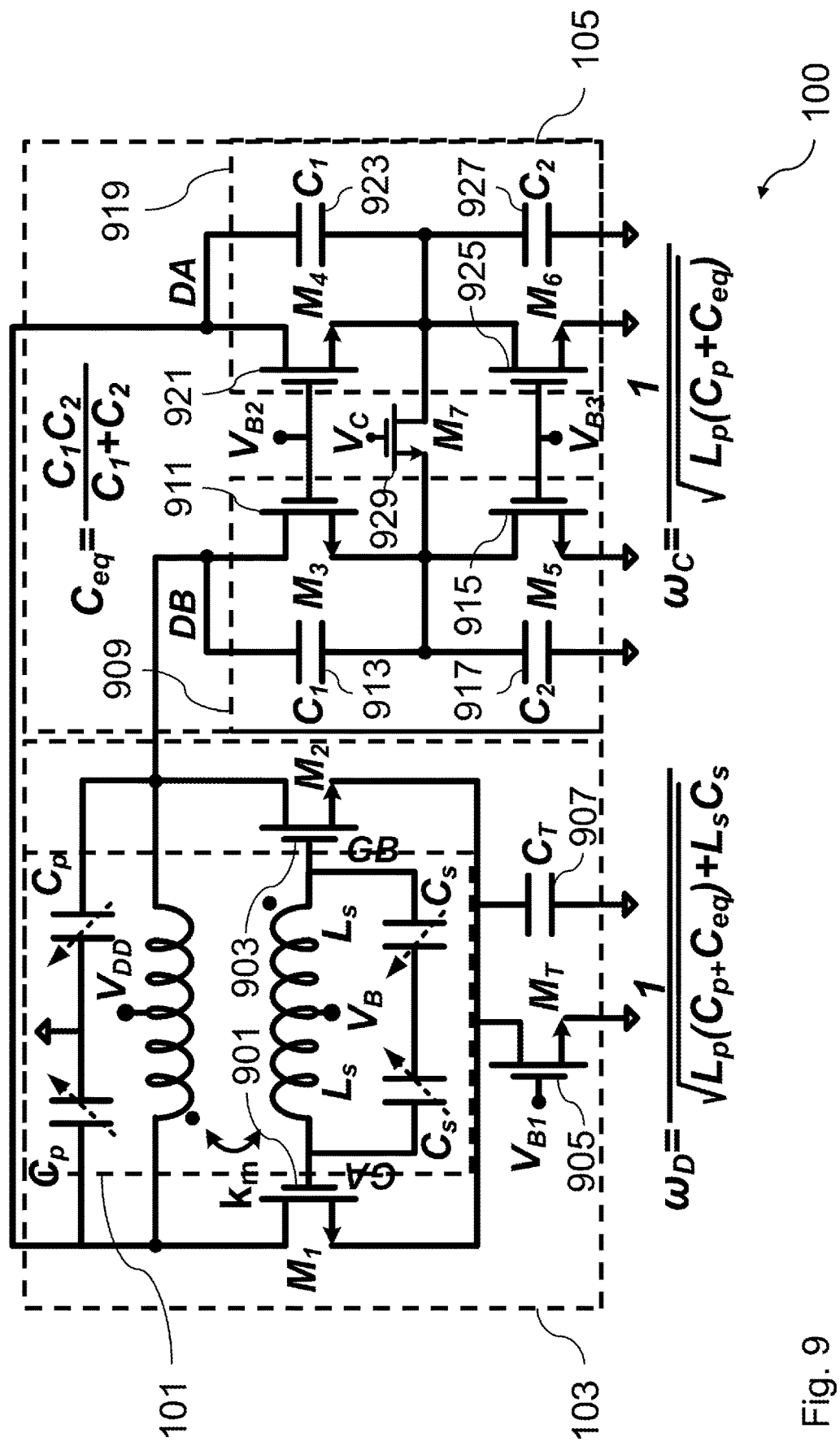
FIG. 9 shows a diagram of a radio frequency oscillator according to an embodiment.

FIG. 9 shows a diagram of a radio frequency oscillator 100 according to an embodiment. The radio frequency oscillator 100 comprises a resonator circuit 101 being resonant at an excitation of the resonator circuit 101 in a differential mode and at an excitation of the resonator circuit 101 in a common mode, wherein the resonator circuit 101 has a differential mode resonance frequency at the excitation in the differential mode, and wherein the resonator circuit 101 has a common mode resonance frequency at the excitation in the common mode, a first excitation circuit 103 being configured to excite the resonator circuit 101 in the differential mode to obtain a differential mode oscillator signal oscillating at the differential mode resonance frequency, and a second excitation circuit 105 being configured to excite the resonator circuit 101 in the common mode to obtain a common mode oscillator signal oscillating at the common mode resonance frequency.

The resonator circuit 101 forms an implementation of the resonator circuit 101 as described in conjunction with FIG. 3. The first excitation circuit 103 comprises a transistor 901, a transistor 903, a tail transistor 905, and a tail capacitor 907. The second excitation circuit 105 comprises a first auxiliary oscillator 909, the first auxiliary oscillator 909 comprising a transistor 911, a capacitor 913, a transistor 915, and a capacitor 917. The second excitation circuit 105 further comprises a second auxiliary oscillator 919, the second auxiliary oscillator 919 comprising a transistor 921, a capacitor 923, a transistor 925, and a capacitor 927.

The resonator circuit 101 and the first excitation circuit 103 are arranged to form a transformer-coupled oscillator to obtain the differential mode oscillator signal. The resonator circuit 101 and the second excitation circuit 105 are arranged to form a Colpitts oscillator to obtain the common mode oscillator signal.

The first auxiliary oscillator 909 and the second auxiliary oscillator 919 are connected by a transistor 929. The first auxiliary oscillator 909 is synchronizable with regard to the second auxiliary oscillator 919 in frequency and phase via the transistor 929. The first auxiliary oscillator 909 can be injection-locked on the second auxiliary oscillator 919.

Exciting the resonator circuit 101, in particular the transformer 201 of FIG. 2, in the differential mode to obtain the differential mode oscillator signal oscillating at the differential mode resonance frequency can be achieved e.g. by using a cross-coupled gm-pair structure or a transformer-coupled structure within the first excitation circuit 103. A separate second excitation circuit 105 may be used in order to excite the resonator circuit 101 in the common mode. Thus, a dual mode oscillation in terms of a differential mode oscillation and a common mode oscillation can be provided.

The described structure is depicted in FIG. 9. The first excitation circuit 103 of the radio frequency oscillator 100 is structured according to a transformer-coupled structure for obtaining the differential mode oscillation in conjunction with the resonator circuit 101. The second excitation circuit 105 of the radio frequency oscillator 100 is structured as a Colpitts oscillator in conjunction with the resonator circuit 101. The Colpitts oscillator is single-ended. The Colpitts oscillator comprises two auxiliary oscillators 909, 919, in particular two cores, with the auxiliary oscillators 909, 919 being injection-locked through the transistor 929 or M7 switch. Both auxiliary oscillators 909, 919 can start oscillating at the same frequency but slightly out of phase. Later, the auxiliary oscillators 909, 919 can lock and there may be no phase shift between them. Therefore, the resonator circuit 101, in particular the transformer, is excited in the common mode to obtain the common mode oscillator signal oscillating at the common mode resonance frequency. The injection-locking of the two auxiliary oscillators 909, 919 can lead to a 3 dB improvement in phase noise performance. The radio frequency oscillator 100 can exhibit a phase noise characteristic having two distinctive regions.

When exciting in differential mode, the voltages $V_{B2}$ and $V_{B3}$ can be zero, i.e. $V_{B2}=V_{B3}=0$, and the transistor 929 can be switched off for providing an efficient excitation in differential mode. When exciting in common mode, the voltage $VB_1$ can be zero, i.e. $V_{B1}=0$, and the transistor 929 can be switched on.

The differential mode resonance frequency COD and the common mode resonance frequency we can be determined according to the following equations:

$$\omega_D = \frac{1}{\sqrt{L_p(C_p + C_{eq}) + L_s C_s}}$$

$$\omega_C = \frac{1}{\sqrt{L_p(C_p + C_{eq})}}$$

$$C_{eq} = \frac{C_1 C_2}{C_1 + C_2}$$

wherein $C_{eq}$ denotes an equivalent capacitance determined upon the basis of the capacitances of the capacitors 913, 917, 923, 927.

In order to relax the start-up conditions e.g. of the Colpitts oscillator, $C_{eq}$ can be designed to be larger than $C_p$ through the tuning range. This may reduce the tuning range of both the differential mode and common mode oscillations. The reduced tuning range can be more visible in common mode since in differential mode the primary and secondary capacitors can both affect the resonance frequency. By choosing $L_s C_s > L_p C_p$, this effect can be reduced even more in differential mode, without changing the common mode conditions.

Figure 10:
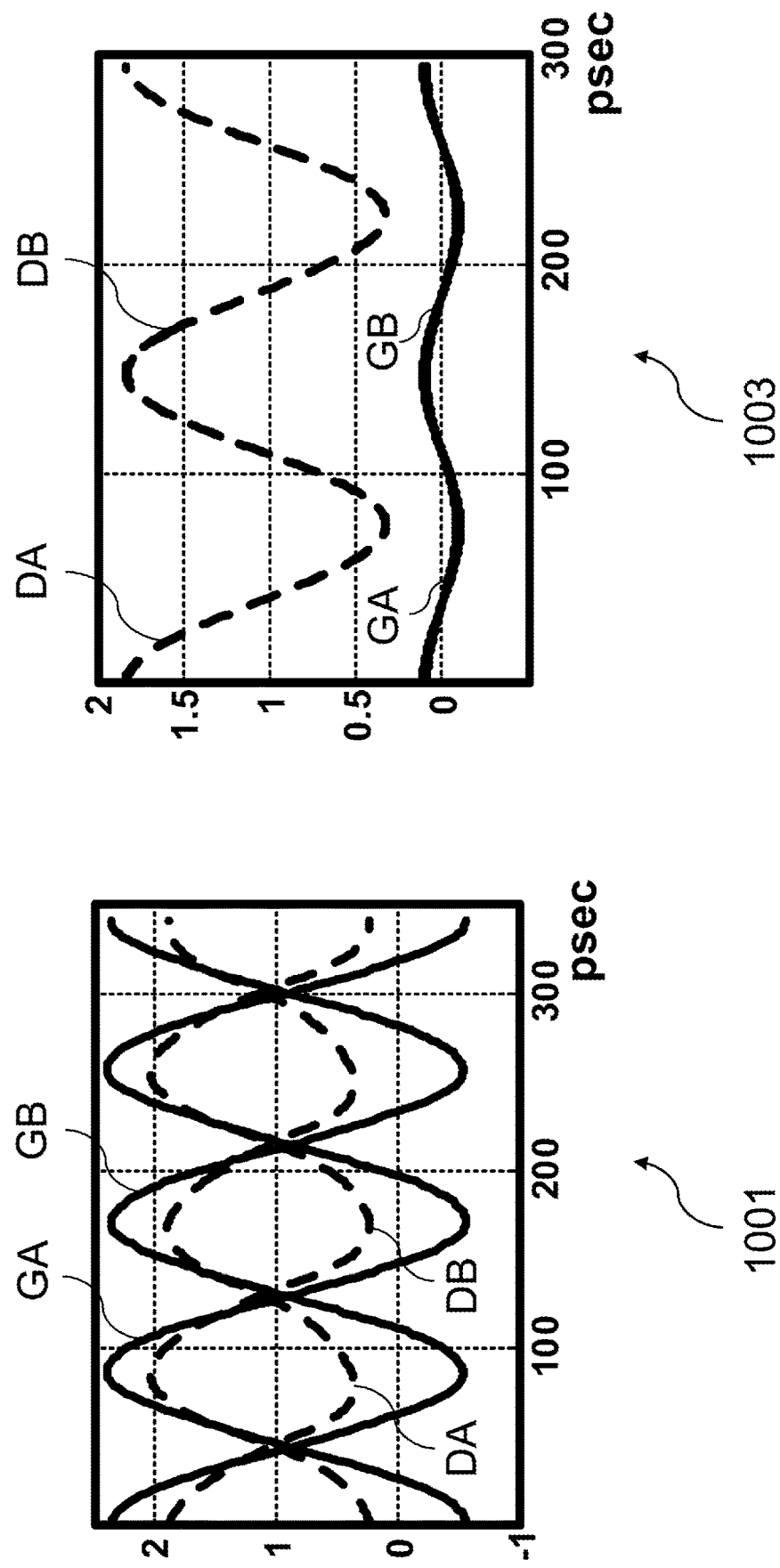
FIG. 10 shows a diagram of differential mode oscillator signals and common mode oscillator signals according to an embodiment.

FIG. 10 shows a diagram of differential mode oscillator signals 1001 and common mode oscillator signals 1003 according to an embodiment. The differential mode oscillator signals 1001 and the common mode oscillator signals 1003 are depicted for probe positions GA, GB, DA, and DB as shown in FIG. 9. The differential mode oscillator signals 1001 and the common mode oscillator signals 1003 are sinusoidal signals over time.

Embodiments of the invention use different characteristics of a 1:2 transformer 201 in differential mode excitation and in common mode excitation, and use an additional common mode oscillator signal to a differential mode oscillator signal, using the same resonator circuit 101 and hence imply no die area penalty. Furthermore, since differential mode and common mode start-up circuits can share the same output, there may be no need for multiplexing and hence no noise floor degradation.

The invention claimed is:
1. A radio frequency oscillator, comprising:
   a resonator circuit comprising:
      a primary winding and a secondary winding,
      a primary capacitor connected to two ends of the primary winding, and
      a secondary capacitor connected to two ends of the secondary winding,
   wherein the resonator circuit is resonant and having differential mode resonance frequency at an excitation of the resonator circuit in a differential mode, and
   wherein the resonator circuit is resonant and having a common mode resonance frequency at an excitation of the resonator circuit in a common mode,
   wherein the primary capacitor comprises a pair of single-ended capacitors, and
   wherein the secondary capacitor comprises a pair of differential capacitors.

2. The radio frequency oscillator of claim 1, wherein the primary winding and the secondary winding are arranged on the same plane.

3. The radio frequency oscillator of claim 1 further comprising an excitation circuit, wherein the resonator circuit and the excitation circuit are arranged to form a cross-coupled oscillator to obtain the differential mode oscillator signal.

4. The radio frequency oscillator of claim 1 further comprising a first oscillator and a second oscillator, wherein the first oscillator is configured to be synchronized with the second oscillator in frequency and phase.

5. The radio frequency oscillator of claim 1, wherein the pair of differential capacitors are configured to be not seen by excitation signals of the common mode.

6. The radio frequency oscillator of claim 1, wherein the pair of single-ended capacitors comprise a first capacitor and a second capacitor,
   wherein a first end of the first capacitor is coupled to a first end of the primary winding, and a second end of the first capacitor is coupled to a ground potential,
   wherein a first end of the second capacitor is coupled to a second end of the primary winding, and a second end of the second capacitor is coupled to the ground potential.

7. The radio frequency oscillator of claim 6, wherein the pair of single-ended capacitors further comprise a first transistor and a second transistor,
- wherein the first transistor is configured to connect and disconnect the first capacitor between the first end of the primary winding and the ground potential,
- wherein the second transistor is configured to connect and disconnect the second capacitor between the second end of the primary winding and the ground potential.

8. The radio frequency oscillator of claim 7, wherein the gate of the first transistor and the gate of the second transistor are coupled to a same control signal from an inverter.

9. The radio frequency oscillator of claim 1, wherein the pair of differential capacitors comprise a first differential capacitor and a second differential capacitor, wherein the first differential capacitor and the second differential capacitor are connected in series.

10. The radio frequency oscillator of claim 4, wherein the first oscillator and the second oscillator are configured to produce 3 dB improvement in phase noise.

\* \* \* \* \*